(12) United States Patent
Nakagawa et al.

(10) Patent No.: US 8,896,914 B2
(45) Date of Patent: Nov. 25, 2014

(54) OPTICAL AMPLIFYING DEVICE

(75) Inventors: Goji Nakagawa, Sagamihara (JP);
Susumu Kinoshita, Fuchu (JP)

(73) Assignee: Fujitsu Limited, Kawasaki (JP)

(*) Notice: Subject to any disclaimer, the term of this patent is extended or adjusted under 35 U.S.C. 154(b) by 226 days.

(21) Appl. No.: 13/523,082

(22) Filed: Jun. 14, 2012

(65) Prior Publication Data
US 2013/0038925 A1 Feb. 14, 2013

(30) Foreign Application Priority Data

Aug. 11, 2011 (JP) ................................. 2011-176178

(51) Int. Cl.
| H01S 4/00 | (2006.01) |
| G02B 5/30 | (2006.01) |
| H01S 5/50 | (2006.01) |
| H01S 5/022 | (2006.01) |
| H01S 5/00 | (2006.01) |
| H04B 10/12 | (2006.01) |
| H01S 3/00 | (2006.01) |

(52) U.S. Cl.
CPC ............... H01S 5/0064 (2013.01); H01S 5/50 (2013.01); H01S 5/02216 (2013.01); *H01S 3/0064* (2013.01)
USPC .......................... 359/337; 359/344; 359/484.1

(58) Field of Classification Search
USPC ....................................... 359/337, 344, 484.1
See application file for complete search history.

(56) References Cited

U.S. PATENT DOCUMENTS

| 5,375,009 | A  | * | 12/1994 | Otani et al. | .................... | 359/282 |
| 6,532,321 | B1 | * | 3/2003 | Zhang et al. | ..................... | 385/27 |
| 6,535,324 | B1 | * | 3/2003 | Hwang et al. | ................. | 359/283 |
| 6,674,570 | B2 | * | 1/2004 | Song et al. | ..................... | 359/349 |
| 6,757,097 | B1 | * | 6/2004 | Frisken | ........................ | 359/337 |
| 6,760,160 | B2 | * | 7/2004 | Zhang et al. | .................... | 359/629 |
| 7,031,048 | B2 | * | 4/2006 | Kim et al. | ...................... | 359/333 |
| 7,242,517 | B2 | * | 7/2007 | Ghidini et al. | ............... | 359/333 |
| 2003/0072075 | A1 | * | 4/2003 | Li et al. | ....................... | 359/341.3 |

FOREIGN PATENT DOCUMENTS

| JP | 2004186560 A | * | 7/2004 | ............... H01S 3/10 |
| JP | 2005-19639 | | 1/2005 | |

* cited by examiner

*Primary Examiner* — Eric Bolda
(74) *Attorney, Agent, or Firm* — Staas & Halsey LLP

(57) ABSTRACT

An optical amplifying device includes an optical system including a first end and a second end, the optical system configured to receive signal light through the first end, to lead the received signal light to an optical amplifying medium, and to output the signal light amplified by the optical amplifying medium through the second end, the optical system including a first optical isolator and a second optical isolator which are arranged on respective sides of the optical amplifying medium, wherein with respect to a direction in which the signal light propagates, each of the first optical isolator and the second optical isolator is capable of allowing light propagating in the same direction to pass therethrough and blocking light propagating in the opposite direction, and the first optical isolator and the second optical isolator have different center isolation wavelengths for the light propagating in the opposite direction.

11 Claims, 9 Drawing Sheets

OPTICAL AMPLIFYING DEVICE

CROSS-REFERENCE TO RELATED APPLICATION

This application is based upon and claims the benefit of priority of the prior Japanese Patent Application No. 2011-176178, filed on Aug. 11, 2011, the entire contents of which are incorporated herein by reference.

FIELD

The embodiment discussed herein is related to an optical amplifying device that suppresses resonant behavior occurring due to reflected return light by using an optical isolator.

BACKGROUND

In a typical optical amplifying device, when part of amplified signal light is reflected along an optical path on the output side, this reflected return light may cause resonant behavior through an optical path loop that passes through an optical amplifier. As a technique that suppresses the resonant behavior occurring due to the reflected return light, a structure is known in which an optical isolator is disposed in the vicinity of the input or output end of an optical amplifying device.

Here, a brief description will be given of the resonant behavior of an optical amplifying device and the function of an optical isolator therein, with reference to FIGS. 1A to 1C. When there are two reflection points R1 and R2 on an optical path along which a signal light Ls travels in one direction as illustrated in FIG. 1A, part of the signal light Ls is reflected at the downstream reflection point R2, and reflected return light Lr, which is the reflected part of the signal light Ls, propagates along the optical path in a direction opposite to that in which the signal light Ls travels. This reflected return light Lr is reflected at the upstream reflection point R1 again, and then propagates along the optical path in a direction the same as that in which the signal light Ls travels. Further, the component of the reflected return light Lr which has passed through the reflection point R2 becomes crosstalk light Lxt for the original signal light Ls.

In the case where an optical amplifying device (AMP) is disposed on the optical path between the reflection points R1 and R2 as illustrated in FIG. 1B, the signal light Ls is amplified by the optical amplifying device, and in turn, the reflected return light Lr is amplified twice at each reciprocation. Note that in FIGS. 1A to 1C, the thickness of each arrow represents a light intensity thereof. When the reflection points R1 and R2 are present on the respective sides of the optical amplifying device as described above, the intensity of the crosstalk light Lxt may be increased by the resonant structure created between the reflection points. As a result, there are cases where the quality of the signal light Ls output from the optical amplifying device is deteriorated.

In order to decrease the intensity of the crosstalk light Lxt which has been increased in this manner, it is effective to dispose an optical isolator (ISO) on the optical path between the reflection points R1 and R2 as illustrated in FIG. 1C. For example, in FIG. 1C, the optical isolator is disposed on the signal output side of the optical amplifying device. This optical isolator has a property of allowing light propagating in the same direction as that in which the signal light Ls propagates to pass therethrough, but blocking light propagating in the opposite direction. In this configuration, the signal light Ls is delivered to the optical isolator after being amplified by the optical amplifying device, and then, part of the signal light Ls having passed through the optical isolator is reflected at the reflection point R2.

The reflected return light Lr is delivered to the optical isolator in the direction opposite to that in which the signal light Ls travels. Accordingly, almost all components of the reflected return light Lr are blocked by the optical isolator. Thus, the reflected return light Lr that would reach the reflection point R1 through the optical amplifying device is substantially extinguished. This results in effectively decreasing the intensity of the crosstalk light Lxt, which may have been increased in the above manner. Although FIG. 1C illustrates the example in which the optical isolator is disposed on the signal output side of the optical amplifying device, it is possible to produce the same effect by disposing the optical isolator on the signal input side thereof.

As an example of the related art regarding the application of an optical isolator to an optical amplifying device as described above, for example, Japanese Laid-open Patent Publication No. 2005-19639 discloses a structure of an optical module that generates laser light, in which a first optical isolator and a second optical isolator are arranged on an optical axis of laser light output from a semiconductor laser diode. The first optical isolator in the optical module has a light shielding property, the center wavelength of which is designed to block light of the same wavelength as the light emitting wavelength of the semiconductor laser diode.

Meanwhile, the second optical isolator has a light shielding property, the center wavelength of which is designed to block light of a wavelength shorter than the light emitting wavelength of the semiconductor laser diode. This structure enables the first optical isolator to block the reflected return light of the laser light, such as light of a 1.55 μm band, which the optical module outputs to an optical fiber, and in turn, the second optical isolator to block external noise light of a wavelength shorter than the light emitting wavelength of the semiconductor laser diode, such as excitation light of a 1.48 μm band. This makes it possible to suppress the influences of the reflected return light of the laser light and the external noise light upon the semiconductor laser diode, for example, upon the destabilization of the internal laser oscillation in the semiconductor laser diode.

A typical optical isolator has an isolation of about −30 dB for light traveling in the direction in which light is blocked, and this isolation depends on the wavelength of incoming light. Note that the isolation I [dB] of an optical isolator is defined by, $$I = 10 \cdot \log(P_{out}/P_{in}),$$

where Pin [W] is the power of input light traveling in the blocking direction, and Pout [W] is the power of output light traveling in the blocking direction.

FIG. 2 depicts an example of an isolation-wavelength property of a typical optical isolator by using a solid line. As depicted in FIG. 2, a typical isolation-wavelength property I has a minimum peak of the isolation at a given wavelength. Accordingly, a wavelength bandwidth of light (thereinafter, called an "isolation bandwidth") which an optical isolator may substantially block is limited to a given wavelength range having, at a center thereof, a wavelength peak at which the isolation is a minimum. For example, when an optical isolator having an isolation performance where the light transmittance is equal to or less than −30 dB is requested, a wavelength range IB depicted in FIG. 2 becomes an isolation bandwidth.

When an optical amplifying device has a gain bandwidth narrower than the isolation bandwidth of the above optical isolator, a single isolator may be used to decrease the intensity of the crosstalk light as illustrated in FIG. 1C. Alternatively, a plurality of optical isolators having the same optical property may be used in combination. Meanwhile, when an optical amplifying device has a gain-wavelength property G as indicated by a dotted line in FIG. 2, and a gain bandwidth GB thereof is wider than the isolation bandwidth IB of the optical isolator, the components of reflected return light which fall within the gain bandwidth GB but outside the isolation bandwidth IB are not blocked sufficiently. In this case, it is disadvantageously difficult to decrease the intensity of the crosstalk light by using a single optical isolator. This disadvantage becomes significant in an optical amplifying device that is known to have a wide gain bandwidth, like one including a combination of a semiconductor optical amplifier (SOA) and a plurality of optical amplifiers having different amplifying bandwidths.

As for the above disadvantage, considering the case where the structure of the above optical module generating laser light with the first and second optical isolators is applied to an optical amplifying device having a wide gain bandwidth, the first optical isolator may block part of light, the wavelength of which falls within the gain bandwidth, because the light emitting wavelength of the semiconductor laser diode in the optical module corresponds to the gain bandwidth of the optical amplifying device.

However, since the second optical isolator is configured to block light of wavelengths falling outside the gain bandwidth, it is difficult to decrease the intensity of the remaining light, or the crosstalk light, which has a wavelength falling within the gain bandwidth and has been not blocked by the first optical isolator. Thus, the related art regarding the suppression of resonant behavior by using an optical isolator has failed to efficiently suppress the resonant behavior occurring due to the reflected return light of the signal light, when an optical amplifying device that may amplify signal light of a wide wavelength bandwidth as a whole is used.

SUMMARY

According to an aspect of the invention, an optical amplifying device includes an optical system including a first end and a second end, the optical system configured to receive signal light through the first end, to lead the received signal light to an optical amplifying medium, and to output the signal light amplified by the optical amplifying medium through the second end, the optical system including a first optical isolator and a second optical isolator which are arranged on respective sides of the optical amplifying medium, wherein with respect to a direction in which the signal light propagates, each of the first optical isolator and the second optical isolator is capable of allowing light propagating in the same direction to pass therethrough and blocking light propagating in the opposite direction, and the first optical isolator and the second optical isolator have different center isolation wavelengths for the light propagating in the opposite direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, the embodiment will be described in detail with reference to the accompanying drawings.

Figure 3:
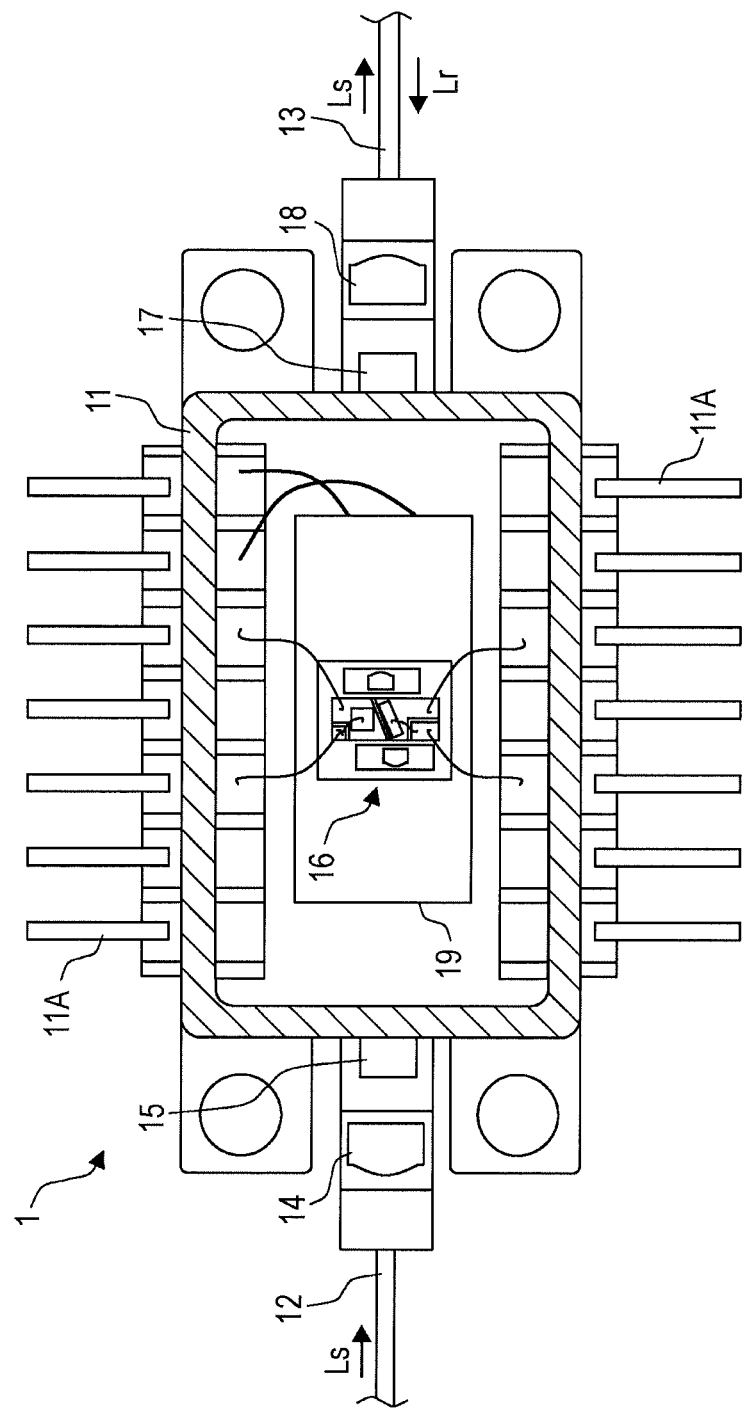
FIG. 3 is a plan view illustrating an exemplary overall structure of an optical amplifying device according to the embodiment.

FIG. 3 is a plan view illustrating an exemplary overall structure of an optical amplifying device according to the embodiment.

Referring to FIG. 3, an optical amplifying device 1 of this embodiment includes, for example, a package 11 that houses a plurality of optical components, an input optical fiber 12 that is connected to one end of the package 11 and leads signal light Ls, or a subject to be amplified, to the interior of the package 11, and an output optical fiber that is connected to the other end of the package 11 and outputs the signal light Ls having been amplified by an optical system in the package 11. Each of the input optical fiber 12 and the output optical fiber 13 is also given as an example of an optical waveguide. The optical fiber is an optical waveguide.

The optical system in the package 11 includes a first input lens 14, a first optical isolator 15, an optical amplifying unit 16, a second optical isolator 17, and a first output lens 18 in this order from the input side to the output side of the signal light Ls. Note that in the structure of FIG. 3, a top cover of the package 11 is omitted and parts of the package 11 to which the optical fibers are connected are illustrated in section, so as to facilitate understanding of the arrangement of the individual optical components in the package 11.

The first input lens 14 is disposed near an end of the input optical fiber 12 from which signal light Ls is to be emitted. This first input lens 14 converts the signal light Ls emitted from the input optical fiber 12 into parallel light, namely, collimates the signal light Ls, and then, delivers the collimated signal light Ls to the first optical isolator 15.

With respect to the direction in which the signal light Ls having passed through the first input lens 14 propagates, the first optical isolator 15 allows light propagating in the same direction to pass therethrough, but blocks light propagating in the opposite direction. This first optical isolator 15 has an isolation-wavelength property, for example, as indicated by a thin continuous line I1 in FIG. 4. For example, the isolation-wavelength property I1 of the first optical isolator 15 is set such that a peak wavelength λ1 at which the isolation is a minimum falls within a bandwidth (referred to as a "gain bandwidth GB") defined 3 dB lower than the maximum gain of a gain-wavelength property G (indicated by a dotted line) in the optical amplifying device 1.

An isolation bandwidth IB1 of the first optical isolator 15, namely, the wavelength range of light which the single optical isolator 15 is allowed to substantially block is narrower than the above gain bandwidth GB. Note that it is preferable for the first optical isolator 15 to employ a polarization-independent structure, which will be described in detail.

Figure 5:
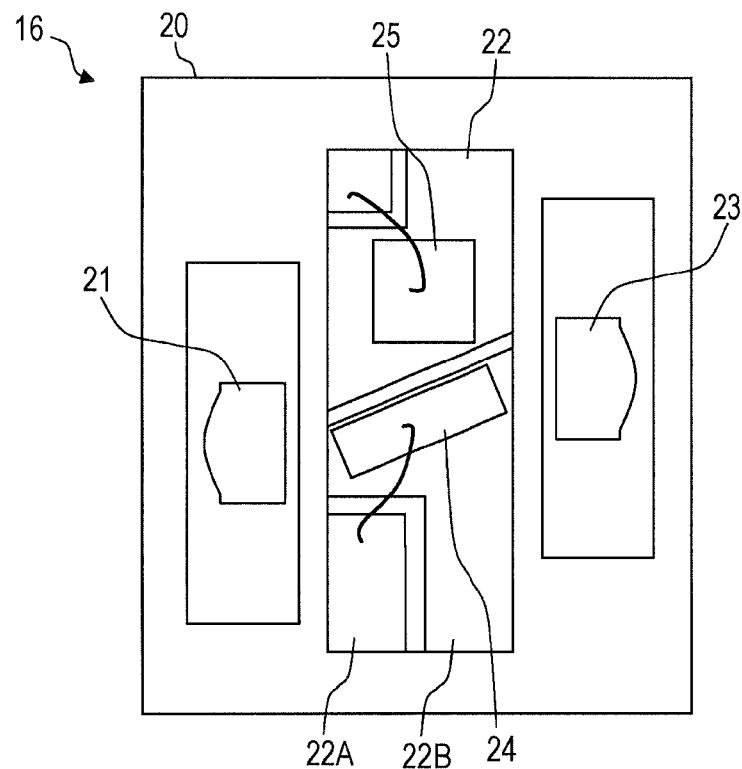
FIG. 5 is an enlarged view illustrating an optical amplifying unit according to the embodiment.

As illustrated in an enlarged view of FIG. 5, for example, the optical amplifying unit 16 includes a second input lens 21, a carrier 22, and a second output lens 23 which are all fixed to the upper surface of a stem 20, and a semiconductor optical amplifier (SOA) element 24 and a thermistor 25 which are both mounted on the carrier 22.

The second input lens 21, the carrier 22, and the second output lens 23 are fixed to the stem 20 at respective given locations thereon, such that the signal light Ls having passed through the first optical isolator 15 is led to the second optical isolator 17 through the second input lens 21, and the SOA element 24 and the second output lens 23 mounted on the carrier 22 in this order. This stem 20 is mounted on the inner surface of the package 11 via a temperature control device 19 (see FIG. 3) such as a Peltier element.

The second input lens 21 collects the signal light Ls emitted from the first optical isolator 15, and couples the collected signal light Ls to one end of the SOA element 24 on the carrier 22. The carrier 22 is configured by forming, for example, on a surface of a substrate material, gold (Au) patterns used to fix the SOA element 24 and the thermistor 25 at respective given locations. The second output lens 23 collimates the signal light Ls emitted from the other end of the SOA element 24, and delivers the collimated signal light Ls to the second optical isolator 17.

The SOA element 24 has the gain bandwidth GB covering a wavelength range of the signal light Ls emitted from the second input lens 21. In addition, the SOA element 24 amplifies the signal light Ls having entered the one end thereof, in accordance with a drive current output from a drive circuit (not illustrated) and, then outputs the amplified signal light Ls to the second output lens 23 from the other end thereof. This SOA element 24 is mounted on the carrier 22 at approximately the center thereof, in accordance with a corresponding Au pattern thereon, and is disposed such that a normal to an end of the SOA element 24 which opposes the second input lens 21 is slightly angled with respect to an optical axis of light emitted from the second input lens 21, as illustrated in FIG. 5.

Positioning the SOA element 24 in the above manner avoids returning light reflected by one end surface of the SOA element 24 to the second input lens 21, as well as light reflected by the other end surface opposing the second output lens 23 to the second output lens 23.

The SOA element 24 has respective electrodes formed on the upper and lower surfaces thereof. The electrode on the upper surface is connected to one of a plurality of electrode pins 11A (see FIG. 3) of the package 11 through the electrode pattern 22A of the carrier 22 by means of wire bonding, whereas the electrode on the lower surface is connected to another one of the plurality of electrode pins 11A of the package 11 through the electrode pattern 22B of the carrier 22.

The thermistor 25 is mounted on the carrier 22 at a location adjacent to the SOA element 24, in accordance with a corresponding Au pattern of the carrier 22, and detects the operating temperature of the SOA element 24. The detection result obtained by the thermistor 25 is utilized to, for example, control the temperature of the SOA element 24 by using the temperature control device 19 (see FIG. 3).

With respect to the direction in which the signal light Ls that has passed through the second output lens 23 of the optical amplifying unit 16 propagates, the second optical isolator 17 (see FIG. 3) allows light propagating in the same direction to pass therethrough, but blocks light propagating in the opposite direction. This second optical isolator 17 has an isolation-wavelength property, as indicated by a thin continuous line I2 in FIG. 4.

Figure 4:
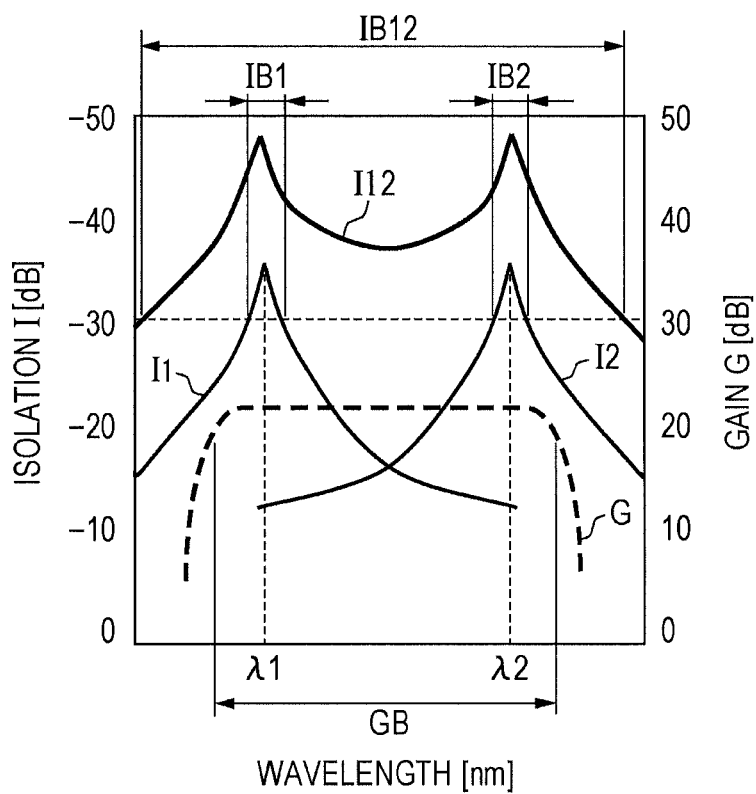
FIG. 4 is a view depicting an isolation-wavelength property of first and second optical isolators according to the embodiment.

For example, the isolation-wavelength property I2 of the second optical isolator 17 is set such that a peak wavelength λ2 at which the isolation is a minimum falls within the gain bandwidth GB of the optical amplifying device 1, and differs from the above peak wavelength λ1 of the first optical isolator 15 (λ1≠λ2). In the example of FIG. 4, the peak wavelengths λ1 and λ2 are set to be located on the shorter wavelength side and the longer wavelength side, respectively, within the gain bandwidth GB.

Figure 1A:
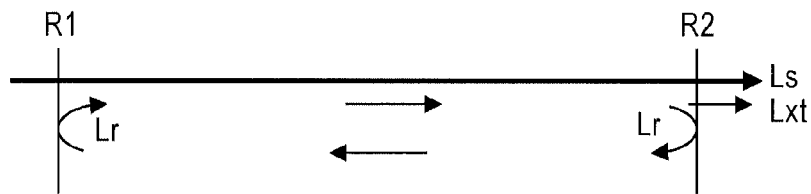
FIGS. 1A to 1C are views for explaining resonant behavior in an optical amplifying device and a function of an optical isolator therein.
Figure 1B:
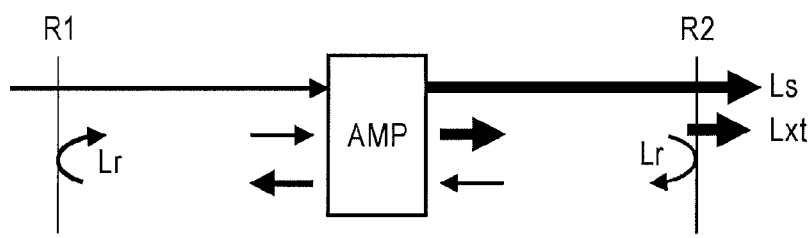
Figure 1C:
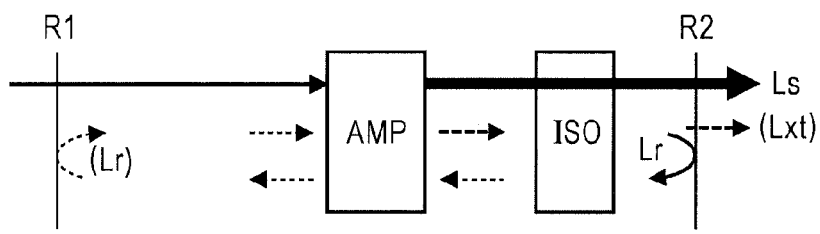
Figure 2:
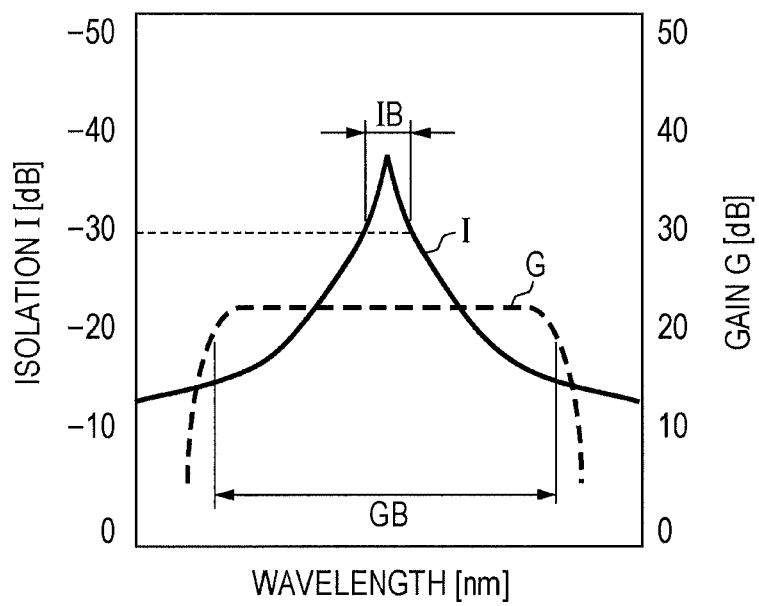
FIG. 2 is a view depicting an isolation-wavelength property of a typical optical isolator.

An isolation bandwidth IB2 of the second optical isolator 17 is narrower than the gain bandwidth GB of the optical amplifying device 1, similar to the above isolation bandwidth IB1 of the first optical isolator 15. However, by setting the peak wavelengths λ1 and λ2 of the first and second optical isolators 15 and 17, respectively, in accordance with the gain bandwidth GB of the optical amplifying device 1 appropriately, an isolation-wavelength property, which is obtained by combining the first and second optical isolators 15 and 17, has a shape as indicated by a thick continuous line I12 in FIG. 4. Accordingly, the isolation bandwidth IB12 is wider than the gain bandwidth GB of the SOA element 24. Note that it is preferable for the second optical isolator 17 to also employ a polarization-independent structure as will be described in detail. The peak wavelengths λ1 and λ2 of the first and second optical isolators 15 and 17, respectively, may be set in the following manner. For example, first, it is assumed that reflection points R1 and R2 are present upstream and downstream, respectively, from the optical amplifying device 1, as illustrated in FIG. 1. Then, the following equation (1) is defined, $$M = G \cdot \{(I1 \cdot r1) \cdot (I2 \cdot r2)\}^{1/2} \tag{1},$$

where M is a performance evaluation value, r1 and r2 are reflection losses at the reflection points R1 and R2 respectively, I1 and I2 are isolation values of the first and second optical isolators 15 and 17 respectively, and G is a gain of the SOA element 24.

Finally, the peak wavelengths λ1 and λ2 of the first and second optical isolators 15 and 17, respectively, are determined by calculation or the like based on characteristics data of the individual optical isolators 15 and 17, such that the performance evaluation value M falls within a given range of, for example, −15 dB to −20 dB, throughout the gain bandwidth GB.

The first output lens 18 is disposed near an end of the output optical fiber 13 which signal light is to enter. This first output lens 18 collects the signal light Ls that has passed through the second optical isolator 17, and couples the signal light Ls to the end of the output optical fiber 13 which signal light is to enter.

Next, a description will be given of an operation of the optical amplifying device 1 according to this embodiment.

In the optical amplifying device 1 configured above, when signal light Ls is led to the interior of the package 11 by the input optical fiber 12, collimated by the first input lens 14, and reaches the first optical isolator 15. Then, the signal light Ls emitted from the first input lens 14 passes through the first optical isolator 15, and reaches the optical amplifying unit 16.

In the optical amplifying unit 16, the signal light Ls that has passed through the first optical isolator 15 is collected by the second input lens 21, and coupled to one end of the SOA element 24. The SOA element 24 is supplied with a drive current through the electrode pins 11A of the package 11 and the electrode patterns 22A and 22B of the carrier 22.

The signal light Ls is amplified by the SOA element 24 with a gain according to the drive current, and is output to the second output lens 23 from the other end of the SOA element 24. Then, the signal light Ls output from the SOA element 24 is collimated by the second output lens 23, and reaches the second optical isolator 17.

The signal light Ls emitted from the second output lens 23 passes through the second optical isolator 17, and reaches the first output lens 18. The signal light Ls that has passed through the second optical isolator 17 is collimated by the first output lens 18, and coupled to one end of the output optical fiber 13.

The amplified signal light Ls that has propagated through the optical system in the above manner is delivered to an optical transmission line connected to the other end of the output optical fiber 13 through, for example, an optical connector. In this case, part of the signal light Ls is reflected from the connected end surface of the optical connector or at a reflection point present in the optical transmission line, and therefore, the reflected light is returned to the optical amplifying device 1. This reflected return light Lr is led to the interior of the package 11 by the output optical fiber 13, and propagates through the optical system inside the package 11 in the direction opposite to that in which the signal light Ls propagates.

For example, the reflected return light Lr led to the interior of the package 11 is collimated by the first output lens 18, and reaches the second optical isolator 17. The component of the reflected return light Lr which has a longer wavelength corresponding to that in the vicinity of the peak wavelength $\lambda 2$ of the second optical isolator 17 is blocked by the second optical isolator 17. Meanwhile, the component of the reflected return light Lr which has a shorter wavelength passes through the second optical isolator 17, and reaches the optical amplifying unit 16.

In the optical amplifying unit 16, the shorter wavelength component of the reflected return light Lr follows the route of the signal light Ls in the opposite direction, so that the shorter wavelength component is amplified in the same manner as the signal light Ls is. However, when the shorter wavelength component of the reflected return light Lr which has been amplified by the optical amplifying unit 16 reaches the first optical isolator 15, this shorter wavelength component is blocked by the first optical isolator 15.

Thus, when the reflected return light Lr propagates through the optical system in the package 11 in the direction opposite to that in which the signal light Ls propagates, almost all the components of the reflected return light Lr are blocked in accordance with the isolation-wavelength property I12 obtained by combining first and second optical isolators 15 and 17 as illustrated in FIG. 4. Accordingly, the reflected return light Lr that would reach the input optical fiber 12 is substantially extinguished.

As described above, the optical amplifying device 1 suppresses the resonant behavior occurring due to the reflected return light Lr of the signal light Ls appropriately, even when the gain bandwidth GB of the optical amplifying device 1 is wider than an isolation bandwidth of a single optical isolator. This enables the optical amplifying device 1 to decrease the intensity of the crosstalk light Lxt that is generated as in FIG. 1C. Note that in the optical amplifying device 1, the first optical isolator 15 is disposed between the first input lens 14 and the optical amplifying unit 16, whereas the second optical isolator 17 is disposed between the optical amplifying unit 16 and the first output lens 14.

Therefore, the fiber connection parts of the package 11 in the optical amplifying device 1 configured by combining two optical isolators having different optical properties are not longer than those of the structure disclosed in the related art. This makes the device compact. This embodiment has been conceived from the standpoint of not blocking all the components of the reflected return light within the gain bandwidth, but simply blocking the reflected return light so as to suppress the resonant behavior occurring due to the reflected return light.

Next, a description will be given, of an exemplary structure of a polarization-independent optical isolator that is appropriately applicable to the first and second optical isolators 15 and 17 of the above optical amplifying device 1.

Figure 6:
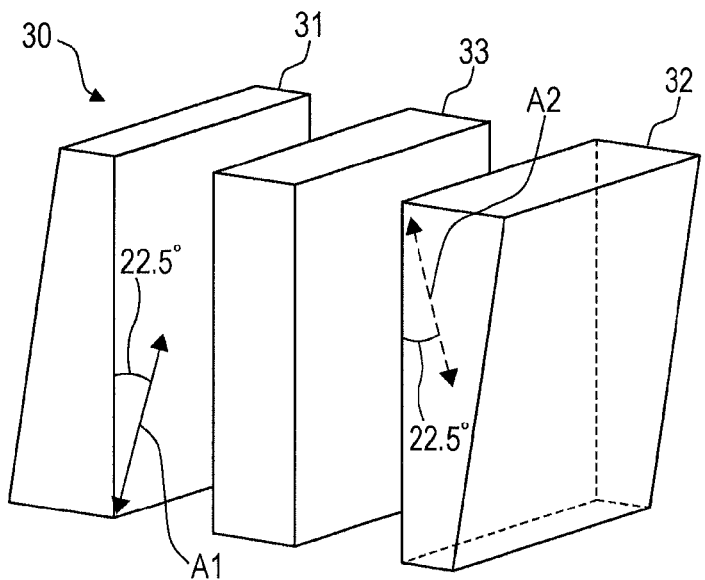
FIG. 6 is a view illustrating an exemplary structure of a polarization-independent optical isolator that is appropriate for the first and second optical isolators according to the embodiment.

FIG. 6 is a schematic view illustrating an exemplary structure of a polarization-independent optical isolator. An optical isolator 30 of this type includes a pair of wedge plates 31 and 32 made of birefringent crystal, and a Faraday rotator 33 disposed therebetween. These wedge plates 31 and 32 are formed by molding birefringent crystal, such that respective wedge-shaped inclined surfaces of the wedge plates 31 and 32 have the same angle. In addition, the wedge plates 31 and 32 are arranged symmetrically on the respective sides of the Faraday rotator 33 while respective optical axes thereof are rotated relative to each other by 45°. In the example of FIG. 6, the optical axes A1 and A2 of the wedge plates 31 and 32 are angled at +22.5° and −22.5°, respectively, with respect to a vertical line. The Faraday rotator 33 has an optical property of emitting incident light while the polarization plane thereof is rotated by 45°.

Figure 7A:
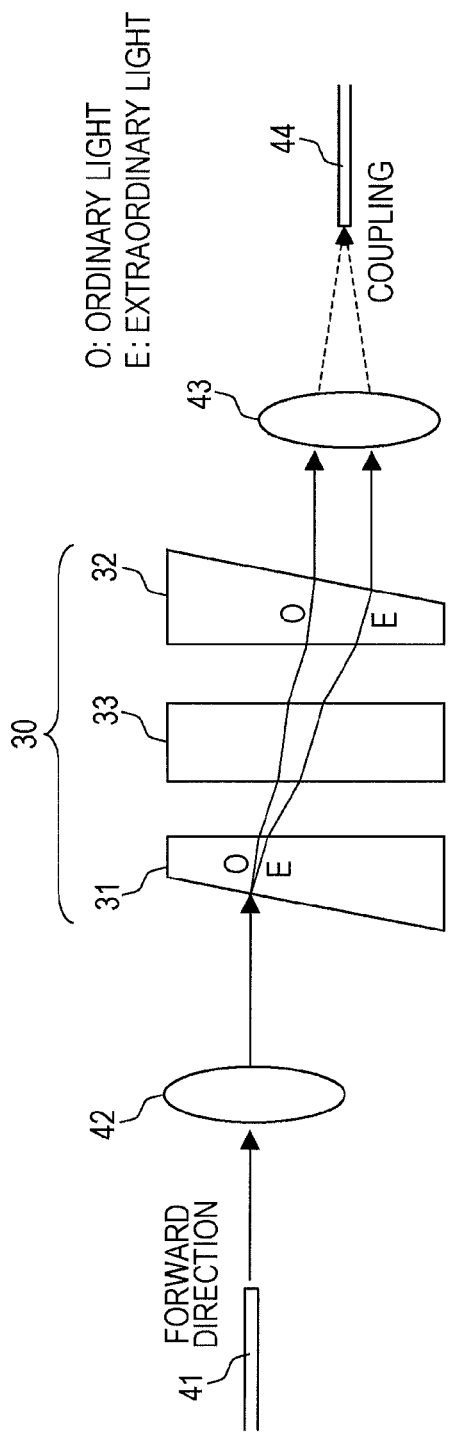
FIGS. 7A and 7B are views for explaining an operation of the polarization-independent optical isolator of FIG. 6.
Figure 7B:
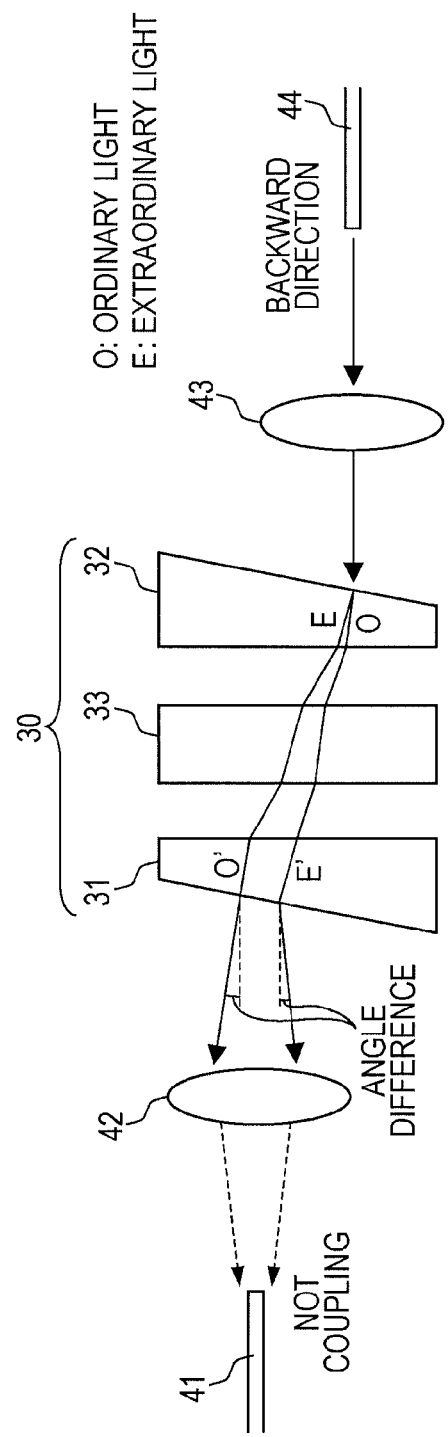

FIGS. 7A and 7B are views for explaining an operation of the polarization-independent optical isolator 30. Specifically, FIGS. 7A and 7B illustrate paths of light traveling in a forward direction and in a backward direction, respectively.

As for the light path in the forward direction in FIG. 7A, first, light that has been emitted from an optical fiber 41 located on the left side of the optical isolator 30 is collimated by a lens 42, and enters the wedge plate 31 of the optical isolator 30. The light having entered the wedge plate 31 is refracted in the forward direction, and is split into two polarized components called "ordinary light O" and "extraordinary light E". In this case, the respective propagation directions of the ordinary light O and the extraordinary light E differ from each other by only a small angle. The ordinary light O and the extraordinary light E which have passed through the wedge plate 31 enter the Faraday rotator 33, and the polarized planes thereof are rotated by 45°. Then, the ordinary light O and the extraordinary light E enter the wedge plate 32, and are refracted therein. The respective polarized components that have become the ordinary light O and the extraordinary light E in the wedge plate 31 are maintained as the ordinary light O and the extraordinary light E even in the wedge plate 32. Therefore, the refraction effect of the wedge plate 31 that has been applied to the ordinary light O and the extraordinary light E is canceled by the wedge plate 32. Consequently, the directions in which the ordinary light O and the extraordinary light E which have passed through the wedge plate 32 travel become parallel to each other. Finally, the ordinary light O and the extraordinary light E are collected by a lens 43 located on the right side of the optical isolator 30, and are coupled to an end surface of the optical fiber 44.

Meanwhile, as for the light path in the backward direction in FIG. 7B, light that has been emitted from the optical fiber 44 located on the right side of the optical isolator 30 is collimated by the lens 43, and enters the wedge plate 32 of the optical isolator 30. The light that has entered the wedge plate 32 in the backward direction is refracted, and is split into ordinary light O and extraordinary light E.

The respective propagating directions of the ordinary light O and the extraordinary light E differ from each other by only a small angle. The ordinary light O and the extraordinary light E which have passed through the wedge plate 32 enter the Faraday rotator 33, and the polarized planes thereof are rotated by 45°. Then, the ordinary light O and the extraordinary light E enter the wedge plate 31, and are refracted therein.

In this case, the respective polarized components which have become the ordinary light O and the extraordinary light E in the wedge plate 32 are converted into extraordinary light E' and ordinary light O' in the wedge plate 31 due to the nonreciprocity of the Faraday rotator 33. In this state, the respective polarized states of light that has entered the wedge plates 32 and 31 differ from each other.

Accordingly, the refraction effect of the wedge plate 32 that has been applied to the ordinary light O and the extraordinary light E is not canceled by the wedge plate 31. In this case, the directions in which the extraordinary light E and the ordinary light O' having passed through the wedge plate 31 travel are not parallel to each other. Specifically, respective angles at which the polarized components travel differ from each other, and the respective polarized components travel far away from each other.

Therefore, after passing through the lens 42 located on the left side of the optical isolator 30, the polarized components are not collected to an end surface of the optical fiber 41. This avoids coupling light traveling in the backward direction to the optical fiber 41.

As described above, the polarization-independent optical isolator 30 allows light propagating in the forward direction to pass therethrough, and blocks light propagating in the backward direction, independent of the polarized state of incident light. Applying this polarization-independent optical isolator 30 to the first and second optical isolators 15 and 17 illustrated in FIG. 3 enables the optical amplifying device 1 to amplify signal light Ls including any polarized components with a desired gain.

It is desirable for the relative arrangement of the optical isolators 15 and 17 to be set such that the respective optical axes thereof are rotated relative to each other by 90°, when the polarization-independent optical isolator 30 is applied to the first and second optical isolators 15 and 17 in the optical amplifying device 1.

Figure 8:
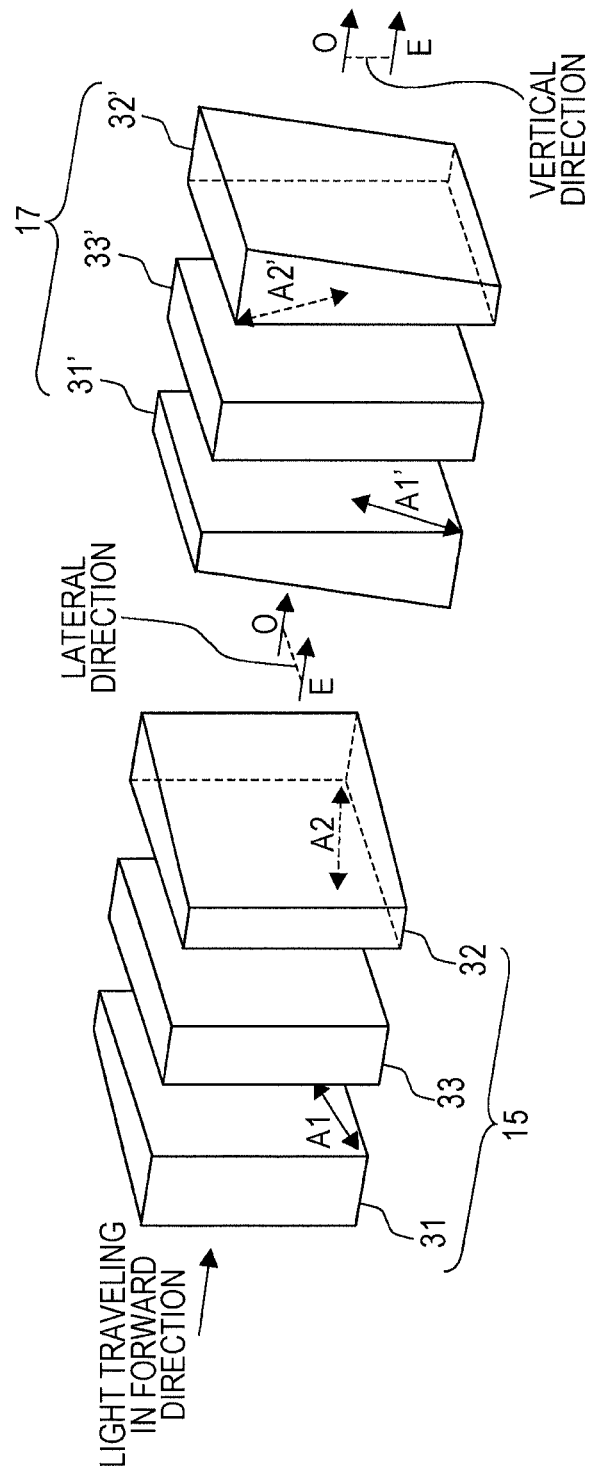
FIG. 8 is a view illustrating a preferred arrangement of polarization-independent optical isolators that are used as the first and second optical isolators in the embodiment.

FIG. 8 is a perspective view illustrating a relative arrangement of, for example, the first optical isolator 15 and the second optical isolator 17. Note that in FIG. 8, any components of the optical amplifying device 1 aside from the first and second optical isolators 15 and 17 are omitted for the sake of making the following description easier.

As illustrated in FIG. 8, as for the arrangement of the first and second optical isolators 15 and 17 to which the polarization-independent optical isolator 30 (see FIG. 6) is applied, the wedge plate 32 of the first optical isolator 15 and a wedge plate 31' of the second optical isolator 17, which oppose each other with the optical amplifying unit 16 (not illustrated) therebetween, are arranged such that an optical axis A2 of the wedge plate 3 is rotated relative to an optical axis A1' of the wedge plate 31' by 90°.

In the above arrangement, when light traveling from the left side in FIG. 8, namely, in the forward direction enters the first optical isolator 15, the light is split into ordinary light O and extraordinary light E. As a result, the ordinary light O and the extraordinary light E are emitted from the first optical isolator 15, and travel in parallel to each other in the lateral plane.

Then, the ordinary light O and the extraordinary light E which have passed through the first optical isolator 15 are amplified by the optical amplifying unit 16, and are converted into ordinary light O' and extraordinary light E', respectively, by the second optical isolator 17. As a result, the ordinary light O' and the extraordinary light E' are emitted from the second optical isolator 17, and travel in parallel to each other in the vertical plane.

As for the above light conversion in the forward direction, since the refraction index of each of the wedge plates 31 and 32 depends on the polarized orientations of the ordinary light O and the extraordinary light E, the ordinary light O and the extraordinary light E entering the first optical isolator 15 are subjected to polarization mode dispersion (PMD). However, the PMD of the first optical isolator 15 is canceled by the PMD of the second optical isolator 17, because the optical axis A2 of the first optical isolator 15 is rotated relative to the optical axis A1' of the second optical isolator 17 by 90°.

Thus, when the polarization-independent optical isolator 30 is applied to the first and second optical isolators 15 and 17 in the optical amplifying device 1, it is preferable for an arrangement in which the respective optical axes of the first and second optical isolators 15 and 17 are rotated relative to each other by 90° to be employed. This achieves the optical amplifying device 1 that resists the influence of the PMD.

Figure 9:
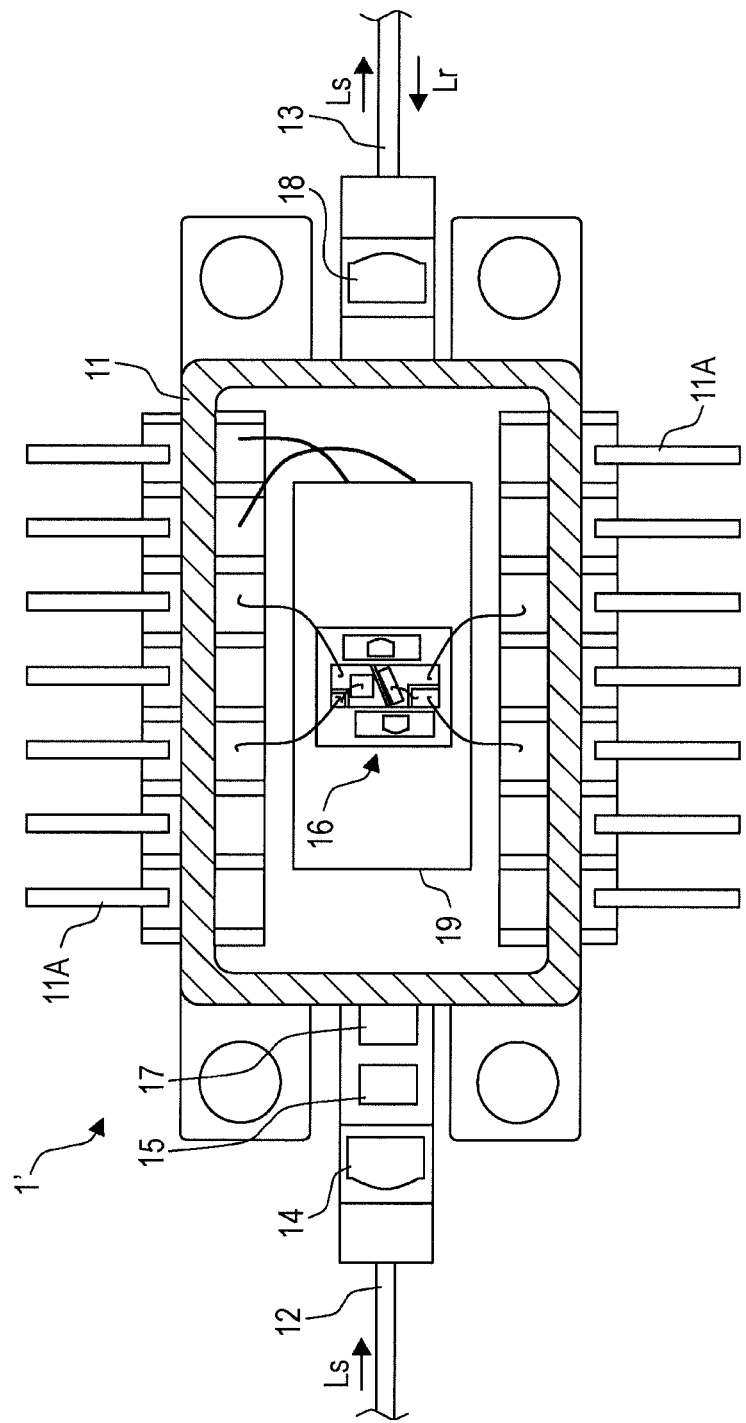
FIG. 9 is a plan view illustrating another exemplary overall structure of an optical amplifying device according to the embodiment.
Figure 10:
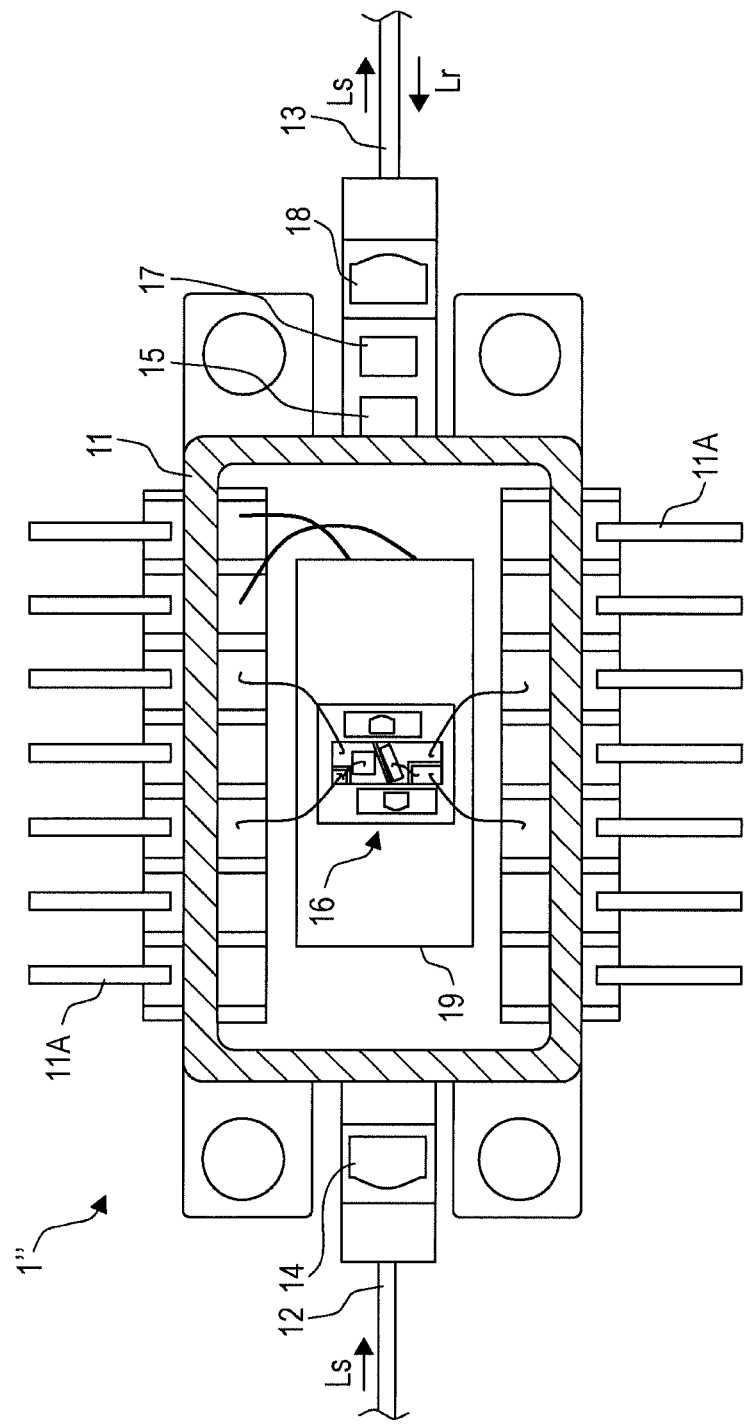
FIG. 10 is a plan view illustrating still another exemplary overall structure of an optical amplifying device according to the embodiment.

In the above embodiment, an example has been given in which the first and second optical isolators 15 and 17 are arranged separately at the signal input and output parts, respectively, of the package 11 to which the optical fibers are connected. However, the first and second optical isolators 15 and 17 may be arranged in combination at either one of parts of the package 11 to which the optical fibers are connected, for example, just like an optical amplifying device 1' illustrated in FIG. 9 or an optical amplifying device 1" illustrated in FIG. 10. It is also possible for these structures to produce the same effect as the above embodiment.

Moreover, in the above embodiment, an example has been given in which combining the two optical isolators 15 and 17 realizes the isolation bandwidth IB12 that is wider than the gain bandwidth GB of the SOA element 24. However, it is obvious that three or more optical isolators whose the peak wavelengths fall within the gain bandwidth and differ from one another may be combined, in order to deal with a wider gain bandwidth.

Furthermore, in the above embodiment, an example has been given in which the SOA element 24 is used as an optical amplifying medium. However, an optical amplifying medium of the embodiment is not limited to an SOA element. Any optical amplifying medium may be applied to the structure of the embodiment, as long as the gain bandwidth of the optical amplifying medium is wider than the isolation bandwidth of a single optical isolator. The above structure of the embodiment is effective for any optical amplifying medium that has a gain bandwidth wider than an isolation bandwidth of a single optical isolator.

The above-described optical amplifying device realizes a continuous isolation bandwidth that is wider than the gain bandwidth by combining first and second optical isolators having different center isolation wavelengths, even when a gain bandwidth of an optical amplifying medium is wider than an isolation bandwidth of a single optical isolator. It is possible for this optical amplifying device to suppress the resonant behavior occurring due to reflected return light of signal light appropriately.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An optical amplifying device, comprising:
an optical system including a first end and a second end, the optical system configured to receive signal light through the first end, to lead the received signal light to an optical amplifying medium, and to output the signal light amplified by the optical amplifying medium through the second end, the optical system including a first optical isolator and a second optical isolator which are arranged on respective sides of the optical amplifying medium,
wherein with respect to a direction in which the signal light propagates, each of the first optical isolator and the second optical isolator is capable of allowing light propagating in the same direction to pass therethrough and blocking light propagating in the opposite direction, and the first optical isolator and the second optical isolator have different center isolation wavelengths for the light propagating in the opposite direction.

2. The optical amplifying device according to claim 1,
wherein in isolation-wavelength properties for light propagating in the opposite direction which the first optical isolator and the second optical isolator have, a peak wavelength at which each of the first optical isolator and the second optical isolator exhibits minimum isolation falls within a gain bandwidth of the optical amplifying medium, the respective peak wavelengths of the first optical isolator and the second optical isolator differ from each other, and an isolation bandwidth of each of the first optical isolator and the second optical isolator is narrower than the gain bandwidth of the optical amplifying medium.

3. The optical amplifying device according to claim 2,
wherein the peak wavelength of the first optical isolator is located on a shorter wavelength side within the gain bandwidth of the optical amplifying medium,
wherein the peak wavelength of the second optical isolator is located on a longer wavelength side within the gain bandwidth of the optical amplifying medium, and
wherein the respective peak wavelengths of the first optical isolator and the second optical isolator are set such that an isolation bandwidth determined by a combination of the first optical isolator and the second optical isolator is wider than the gain bandwidth of the optical amplifying medium.

4. The optical amplifying device according to claim 1,
wherein each of the first optical isolator and the second optical isolator is a polarization-independent optical isolator.

5. The optical amplifying device according to claim 4,
wherein each of the first optical isolator and the second optical isolator comprises:
a pair of wedge plates, each of which is made of birefringent crystal; and
a Faraday rotator disposed between the pair of wedge plates, and
wherein a relative arrangement of the first optical isolator and the second optical isolator is set such that with respect to an optical axis of one of the pair of wedge plates in the first optical isolator which is located closer to the second optical isolator, an optical axis of one of the pair of wedge plates in the second optical isolator which is located closer to the first optical isolator is rotated by 90°.

6. The optical amplifying device according to claim 1,
wherein the optical amplifying medium is a semiconductor optical amplifier element (SOA).

7. The optical amplifying device according to claim 1, further comprising an input waveguide and an output waveguide,
wherein the optical system comprises:
an input lens configured to collimate the signal light from the input optical waveguide;
an optical amplifying unit, the optical amplifying unit configured to receive the signal light from the input lens; and
an output lens configured to couple the signal light output from the optical amplifying unit to an end surface of the output optical waveguide, and
wherein the first optical isolator and the second optical isolator are disposed on a path of the signal light between the input lens and the output lens.

8. The optical amplifying device according to claim 7,
wherein the first optical isolator is disposed on a path of the signal light between the input lens and the optical amplifying unit, and
wherein the second optical isolator is disposed on a path of the signal light between the optical amplifying unit and the output lens.

9. The optical amplifying device according to claim 7,
wherein both the first optical isolator and the second optical isolator are disposed on a path of the signal light between the input lens and the optical amplifying unit.

10. The optical amplifying device according to claim 7,
wherein both the first optical isolator and the second optical isolator are disposed on a path of the signal light between the optical amplifying unit and the output lens.

11. An optical amplifying device, comprising:
an optical system including a first end and a second end, the optical system configured to receive signal light through the first end, to lead the received signal light to an optical amplifying medium, and to output the signal light amplified by the optical amplifying medium through the second end, the optical system including a plurality of optical isolators, each of which is capable of allowing light propagating in a direction the same as a direction in which the signal light propagates to pass therethrough and blocking light propagating in the opposite direction,
wherein in isolation-wavelength properties for light propagating in the opposite direction which the plurality of optical isolators have, a peak wavelength at which each of the plurality of optical isolators exhibits the minimum isolation falls within a gain bandwidth of the optical amplifying medium, the peak wavelengths of the plurality of optical isolators differ from one another, and an isolation bandwidth of each of the plurality of optical isolators is narrower than the gain bandwidth of the optical amplifying medium.

* * * * *